United States Patent

Lin et al.

(10) Patent No.: US 7,515,490 B2
(45) Date of Patent: Apr. 7, 2009

(54) SENSING CIRCUIT FOR ORGANIC MEMORY

(75) Inventors: Jan-Ruei Lin, Taipei County (TW); Shyh-Shyuan Sheu, Taichung (TW); Wei-Jen Chang, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 234 days.

(21) Appl. No.: 11/309,037

(22) Filed: Jun. 12, 2006

(65) Prior Publication Data

US 2007/0171732 A1   Jul. 26, 2007

(30) Foreign Application Priority Data

Dec. 30, 2005   (TW)   .............................. 94147719 A

(51) Int. Cl.
*G11C 7/06* (2006.01)
*G11C 7/10* (2006.01)
*G11C 7/08* (2006.01)
*G11C 11/00* (2006.01)

(52) U.S. Cl. ............................ 365/189.15; 365/189.05; 365/148; 365/151

(58) Field of Classification Search ................. 365/148, 365/151, 158, 163, 167, 189.02, 189.05, 365/189.15

See application file for complete search history.

(56) References Cited

U.S. PATENT DOCUMENTS

| | | | |
|---|---|---|---|
| 5,619,456 A * | 4/1997 | McClure | 365/189.17 |
| 6,108,241 A | 8/2000 | Chevallier | |
| 6,134,147 A * | 10/2000 | Kaneda | 365/185.25 |
| 6,222,762 B1 * | 4/2001 | Guterman et al. | 365/185.03 |
| 6,259,644 B1 * | 7/2001 | Tran et al. | 365/209 |
| 6,282,120 B1 * | 8/2001 | Cernea et al. | 365/185.21 |
| 6,462,981 B2 * | 10/2002 | Numata et al. | 365/158 |
| 7,027,327 B2 * | 4/2006 | Yamamoto et al. | 365/184 |
| 7,170,779 B2 * | 1/2007 | Miyawaki et al. | 365/174 |

FOREIGN PATENT DOCUMENTS

| | | |
|---|---|---|
| CN | 1381071 | 11/2002 |
| CN | 1471712 | 1/2004 |

* cited by examiner

*Primary Examiner*—J. H. Hur
(74) *Attorney, Agent, or Firm*—Jianq Chyun IP Office

(57) ABSTRACT

An organic memory at least includes a number of select lines, a number of data lines, a bit cell array, and a number of digital sensing circuits. The bit cell array includes a number of bit cells, wherein each bit cell includes an organic memory cell and a switch element. Each digital sensing circuit includes a current-to-voltage converter and a sensing block circuit. Therefore, a complete digital sensing mechanism of an organic memory IC is formed and is practicable and suitable for mass-production.

14 Claims, 8 Drawing Sheets

SENSING CIRCUIT FOR ORGANIC MEMORY

CROSS-REFERENCE TO RELATED APPLICATION

This application claims the priority benefit of Taiwan application serial no. 94147719, filed on Dec. 30, 2005. All disclosure of the Taiwan application is incorporated herein by reference.

BACKGROUND OF THE INVENTION

1. Field of Invention

The present invention relates to a memory device, and more particularly, to an organic memory made of organic material.

2. Description of Related Art

In recent years, bistable materials are often used in the fabrication of memory devices, switching devices and so on. The bistable material comprises an inorganic and an organic material. Furthermore, the bistable material can switch between a high and a low resistance state according to the applied voltage. It should be noted that a multi-state memory device could be produced when this type of bistable organic material is disposed between two electrodes and the multi-state memory device has great potential to become the next generation of non-volatile memory.

Compared with a silicon-based device, an organic device fabricated from an organic material has the advantages of a better extensibility and bending capacity. Because the organic material can be coated on virtually any types of surfaces, the idea of forming an organic memory array on a flexible plastic substrate can be realized. Furthermore, the organic material can be fabricated and processed after all the silicon processes have been completed so that the entire processing operation is simplified. Due to the aforementioned advantages and properties, many types of printing manufacturing processes are likely to be developed for mass-producing the organic devices, thereby substantially reducing the production cost of the device and widening its applications.

FIG. 1 is a graph showing the ideal operating curve of an organic memory cell inside an organic memory. The organic memory cell is fabricated using an organic material. As shown in FIG. 1, the organic memory cell has at least a bistable characteristic. That is, the organic memory cell can station in a high resistance state or a low resistance state. When the organic memory cell is in a high resistance state, the relation between the conduction current and the biased voltage follows the indicated path 110. Thus, if a biased voltage $V_R$ is applied to the organic memory cell when the organic memory cell is in the high resistance state, then the conduction current flowing through the organic memory cell will be $l_0$. When the applied biased voltage exceeds $V_{T1}$, the organic memory cell will change from a high resistance state to a low resistance state. Thereafter, the relation between the biased voltage and the conduction current will follow the path 120. Hence, if the applied biased voltage is $V_R$ when the organic memory cell is in the low resistance state, then the conduction current flowing through the organic memory cell is $l_1$, where $l_1 \gg l_0$. After that, if the applied biased voltage is lower than VT0, then the organic memory cell will revert from a low resistance state back to a high resistance state. It should be noted, however, that the characteristic curve in FIG. 1 is highly idealized. In general, if a different organic material is used in the organic memory cell, the characteristic curve may differ slightly. Yet, all in all, the basic characteristics of the organic memory do not change considerably from the ideal characteristic curve shown in FIG. 1.

Accordingly, a memory fabricated using a bistable organic material can have a greater bending capability such that it can be used in an elastic and bendable system with flexible electronic devices. More specifically, the organic memory has a low production cost so that it can become one of the most important electronic memory devices in the world. Hence, there is an urgent need for developing a practical and complete organic memory.

SUMMARY OF THE INVENTION

The present invention provides an organic memory, which forms a complete digital sensing mechanism of the memory IC by using an organic memory cell, a digital sensing circuit, and the like. Therefore, the present invention provides a mass-producible and practicable memory device.

From a point of view, the present invention provides an organic memory, which comprises i select lines, j data lines, a bit cell array, and j digital sensing circuits. The bit cell array comprises a plurality of bit cells; each bit cell comprises an organic memory cell and a switch element. The organic memory cell stores at least one bit of information. At least one of the bit cells is connected between each data line and each select line, and each digital sensing circuit is connected to one of the data lines. The bit cell row B(n) is defined as all bit cells connected to the nth select line. When the nth select line is actuated, the switch elements in the bit cell row B(n) connect the organic memory cells in the bit cell row B(n) to the respective data lines, and the digital sensing circuits sense and read the bit information stored in the organic memory cells of the bit cell row B(n) through the data lines. Here, i, j, n are natural numbers, and n<=i.

From another point of view, the present invention further provides an organic memory, which comprises: i select lines, j data lines, a bit cell array, a multiplexer, and a digital sensing circuit. The bit cell array comprises a plurality of bit cells; at least one of the bit cells is connected between each data line and each select line; each bit cell comprises an organic memory cell and a switch element, and the organic memory cell stores at least one bit information. The multiplexer has an output terminal, a select terminal, and multiple input terminals. Each of the input terminals is connected to one of the data lines respectively, and the output terminal is connected to the digital sensing circuit. One of the input terminals is connected to the output terminal by the multiplexer according to the select terminal, that is, one of the data lines is connected to the digital sensing circuit. The bit cell row B(n) is defined as all bit cells connected to the nth select line, and the bit cell M(m,n) is defined as the bit cell connected to the mth data line and the nth select line. When the nth select line is actuated, and the digital sensing circuit is connected to the mth data line by the multiplexer, the organic memory cells in the bit cell row B(n) are connected to the respective data lines by the switch elements in the bit cell row B(n), and the digital sensing circuit senses and reads the bit information stored in the organic memory cell of the bit cell M(m,n), wherein i, j, m, n are natural numbers, and n<=i, m<=j.

According to the embodiments of the present invention, the digital sensing circuits in the abovementioned two organic memories sense the bit information stored in the organic memory cell according to the conduction current flowing through the organic memory cell. The digital sensing circuit comprises a current-to-voltage converter and a sensing block circuit. The current-to-voltage converter converts the conduction current flowing through the current-to-voltage converter into a voltage signal. The sensing block circuit is coupled to the current-to-voltage converter, receives the voltage signal, and buffer and output the bit information stored in the organic memory cell accordingly.

The current-to-voltage converter comprises: a first transistor, a capacitor, and a second transistor. A first source/drain of the first transistor is connected to a current output/input terminal of the current-to-voltage converter (which can be connected to one of the j data lines or is the output terminal of the multiplexer), and a gate of the first transistor is connected to a first switch signal. The capacitor has a first terminal and a second terminal. The first terminal is connected to a second source/drain of the first transistor, the second terminal is connected to a first potential, and the voltage signal is obtained from the first terminal. A first source/drain of the second transistor is connected to the first terminal of the capacitor; a second source/drain of the second transistor is connected to a second potential; and a gate of the second transistor is connected to a second switch signal. When the first transistor is on, the second transistor is off, and when the first transistor is off, the second transistor is on. For example, if the first transistor and the second transistor are of the same type, the second switch signal is out of phase with the first switch signal. If the first transistor and the second transistor are of different types, the first switch signal is the same as the second switch signal. In the embodiments, the first potential is, for example, a ground potential, and the second potential is, for example, a power potential.

The sensing block circuit comprises a third transistor and a fourth transistor. A first source/drain of the third transistor is connected to the second potential, and a gate of the third transistor is connected to the voltage signal. A first source/drain of the fourth transistor is connected to a second source/drain of the third transistor; a second source/drain of the fourth transistor is connected to the first potential; and a gate of the fourth transistor is connected to the first switch signal. When the fourth transistor is off, the second source/drain of the third transistor outputs the bit information stored in the organic memory cell. In the application of the embodiments, a sample and hold circuit is connected to the output of the sensing block circuit to reshape and output the bit information stored in the organic memory cell.

It should be noted that the organic memory provided by the present invention can be applied as a non-volatile memory.

In summary, the organic memory provided by the present invention at least comprises a plurality of select lines, a plurality of data lines, a bit cell array, and a digital sensing circuit. Therefore, the present invention forms a complete digital sensing mechanism of an organic memory IC, and provides a mass-producible and practicable memory element.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF EMBODIMENTS

Figure 1:
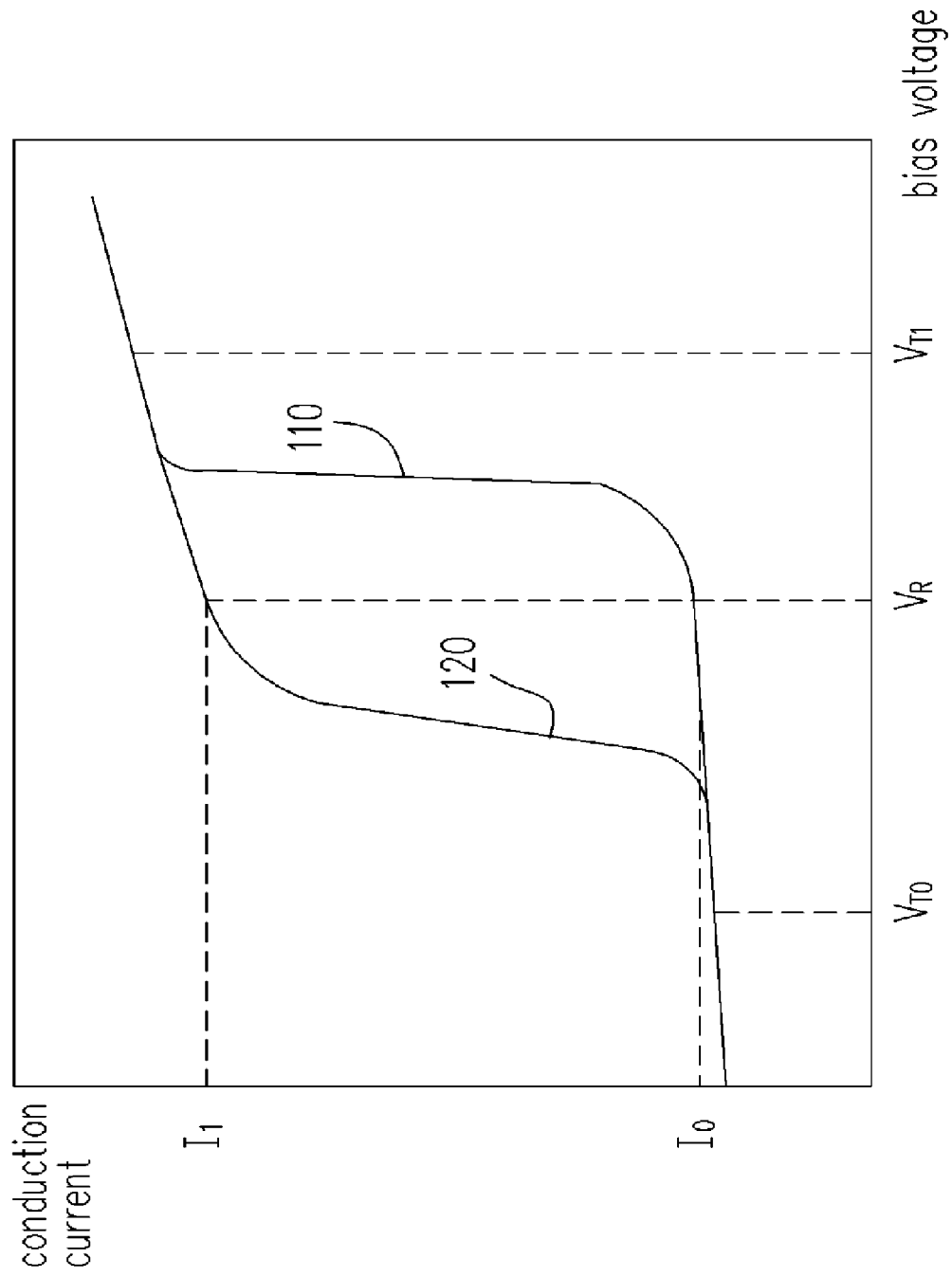
FIG. 1 is a graph showing the ideal operating curve of an organic memory cell inside an organic memory.
Figure 2:
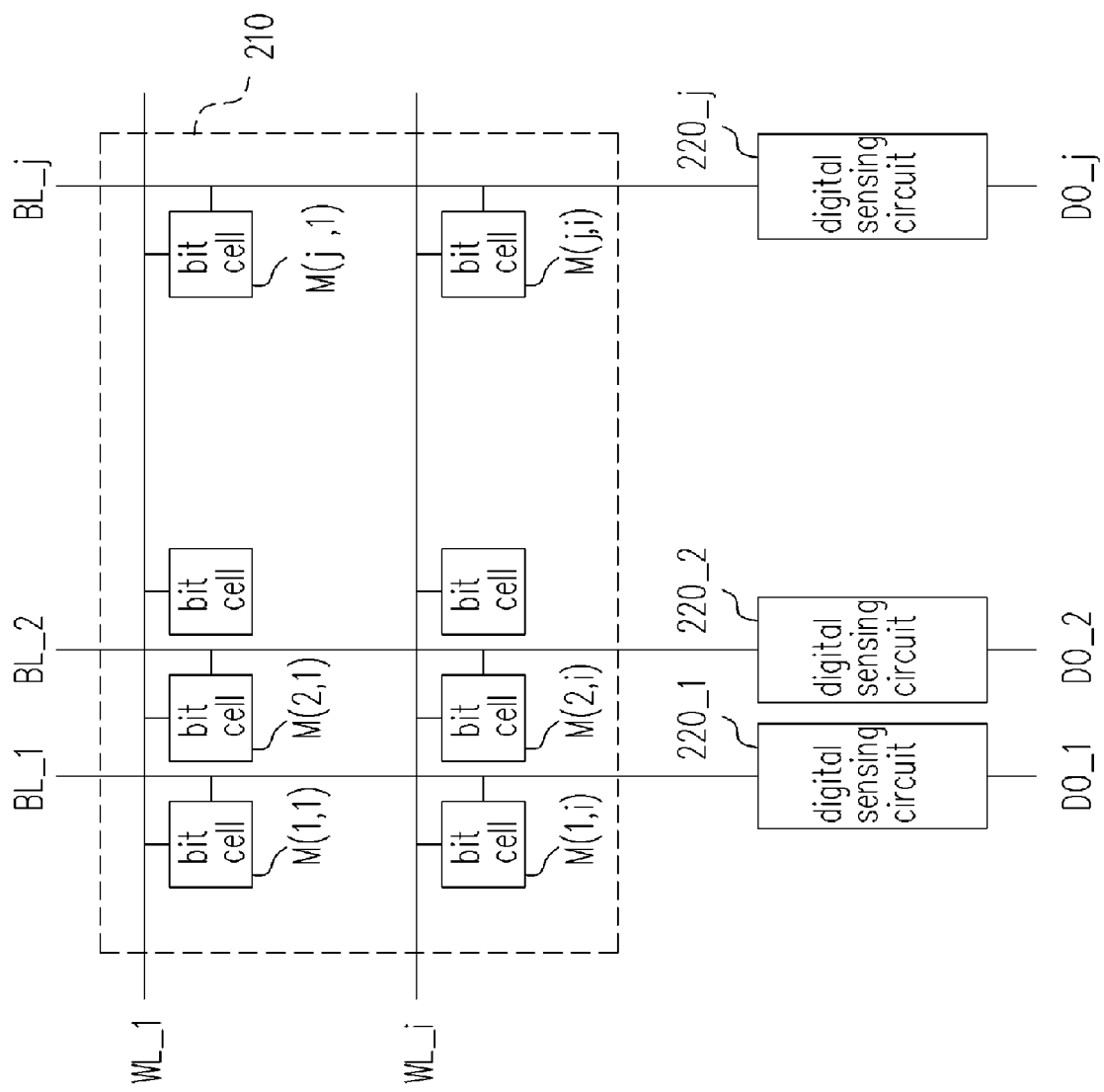
FIG. 2 shows a circuit block diagram of an organic memory according to an embodiment of the present invention.

FIG. 2 shows a circuit block diagram of an organic memory according to an embodiment of the present invention. Referring to FIG. 2, an organic memory provided by the present invention comprises: i select lines $WL\_1, \ldots, WL\_i$, j data lines $BL\_1, BL\_2, \ldots, BL\_j$, a bit cell array 210, and j digital sensing circuits $220\_1, 220\_2, \ldots, 220\_j$. The bit cell array 210 comprises a plurality of bit cells $M(1,1), M(2,1), \ldots, M(j,1), \ldots, M(1,i), M(2,i), \ldots, M(j,i)$. As seen from the drawing, at least one of the bit cells is connected between each data line and each select line, and each digital sensing circuit $220\_1, 220\_2, \ldots, 220\_j$ is respectively connected to the corresponding data line $BL\_1, BL\_2, \ldots, BL\_j$. For easy and clear expression, the bit cell row $B(n)$ is defined as all bit cells $M(1,n), M(2,n), \ldots, M(j,n)$ connected to the nth select line, and the bit cell $M(m,n)$ is defined as a bit cell connected to the mth data line and the nth select line, wherein i, j, m, n are positive integers larger than zero (natural numbers), and $n<=i$, $m<=j$.

Figure 3:
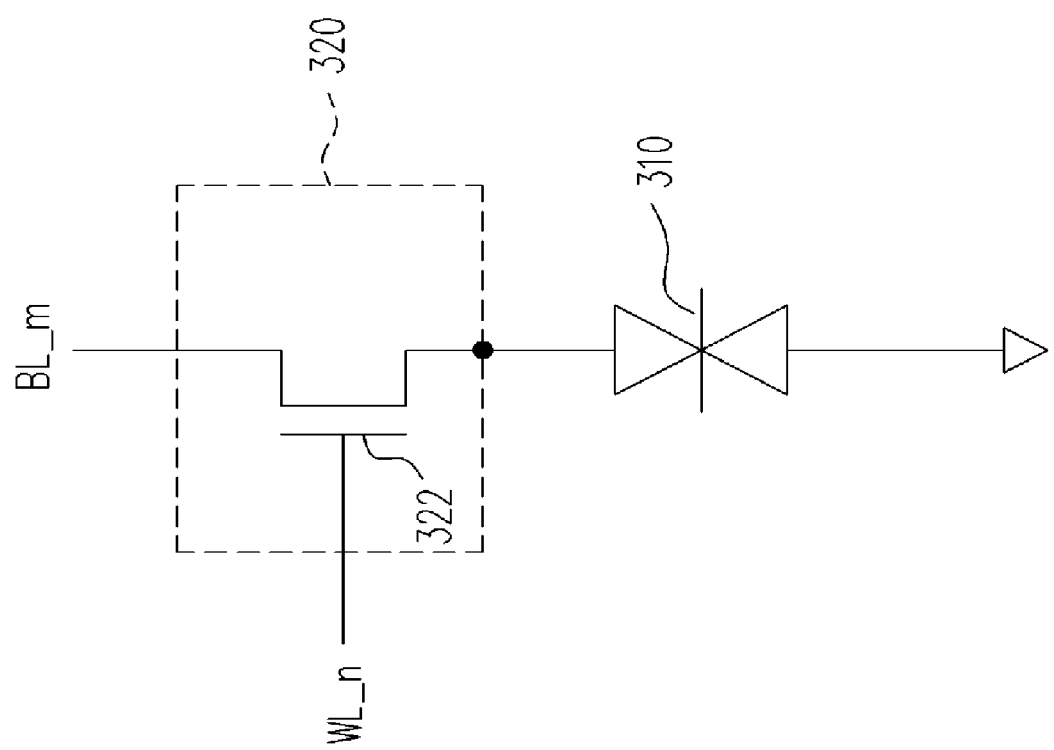
FIG. 3 shows a circuit diagram of an embodiment of the bit cell in FIG. 2.

FIG. 3 shows a circuit diagram of an embodiment of the bit cell in FIG. 2. Referring to FIG. 3, each bit cell in the bit cell array comprises an organic memory cell 310 and a switch element 320. When the switch element is on, the organic memory cell is switched on with the outside of the bit cell. The organic memory cell 310 is, for example, a multi-stable memory element manufactured by disposing the organic material between two electrodes, thus the organic memory cell can be used to store bit information; of course, an organic memory cell is not limited only to storing one-bit information. The switch element 320 is a transistor 322 in this embodiment, which has a first source/drain connected to one of the data lines, a gate connected to one of the select lines, and a second source/drain connected to the organic memory cell 310. The transistor 322 used in this embodiment is an N-type transistor. Of course, other type of transistors, such as a P-type transistor, can also be used.

Referring to FIGS. 2 and 3, when the nth select line is actuated, the switch elements in the bit cell row $B(n)$ connect the organic memory cells in the bit cell row $B(n)$ to the respective data lines, and the digital sensing circuits $220\_1, 220\_2, \ldots, 220\_j$ sense and read the bit information stored in the organic memory cells of the bit cell row $B(n)$ via the respective data lines $BL\_1, BL\_2, \ldots, BL\_j$ connected thereto.

Figure 4:
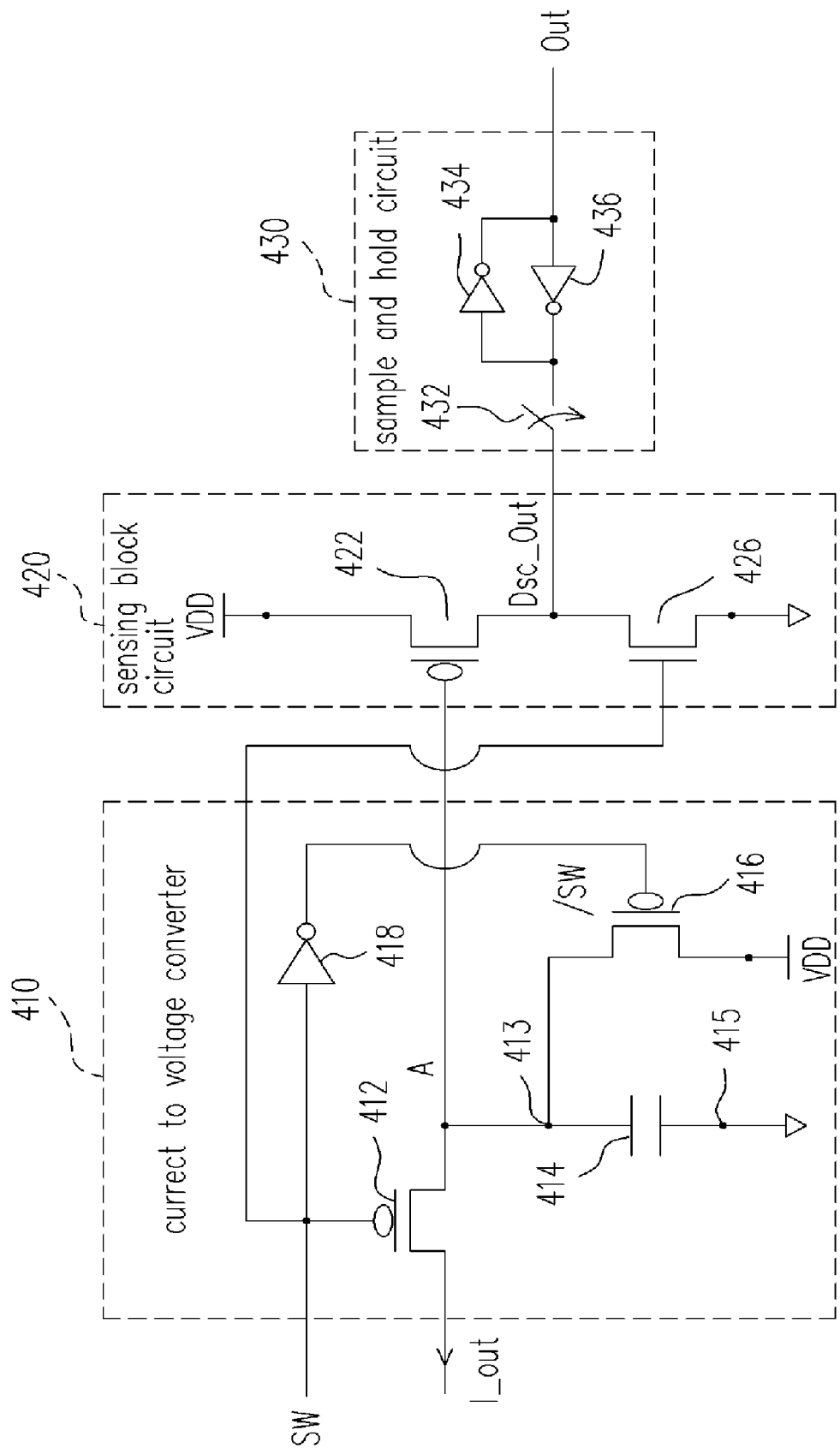
FIG. 4 shows a circuit diagram of an embodiment of the digital sensing circuit in FIG. 2.

The digital sensing circuit senses the bit information stored in the organic memory cell according to the conduction current flowing through the organic memory cell. FIG. 4 shows a circuit diagram of an embodiment of the digital sensing circuit in FIG. 2. Referring to FIG. 4, the digital sensing circuit comprises a current-to-voltage converter 410 and a sensing block circuit 420, which will be described in detail below.

The current-to-voltage converter 410 converts the conduction current 1_out flowing through itself into a voltage signal on a node A. The current-to-voltage converter 410 mainly comprises a first transistor 412, a capacitor 414, and a second transistor 416. A first source/drain of the first transistor 412 is connected to a current output/input terminal of the current-to-voltage converter 410 such that the conduction current 1_out flows through the current output/input terminal. A gate of the first transistor 412 is connected to the first switch signal SW, and a second source/drain of the first transistor 412 is connected to the node A. The capacitor 414 has a first terminal 413 and a second terminal 415, wherein the first terminal 413 is connected to the second source/drain (node A) of the first transistor 412, and the second terminal 415 is connected to a first potential, for example, a ground potential. The voltage signal of node A, as an output signal of the current-to-voltage converter 410, is obtained from a first terminal 413 of the capacitor 414. A first source/drain of the second transistor 416 is connected to the first terminal 413 of the capacitor 414; a second source/drain of the second transistor 416 is connected to a second potential, for example, a power potential VDD; and a gate of the second transistor 416 is connected to a second switch signal /SW.

The design requirement of the current-to-voltage converter 410 of the present invention is: when the first transistor 412 is on, the second transistor 416 is off, and when the first transistor 412 is off, the second transistor 416 is on. For example, if the first transistor 412 and the second transistor 416 are of the same type, the second switch signal /SW is out of phase with the first switch signal SW, and if the first transistor 412 and the second transistor 416 are of different types, the first switch signal SW is the same as the second switch signal /SW. In this embodiment, the first transistor 412 and the second transistor 416 are, for example, both P-type transistors, thus an inverter 418 is disposed between the second switch signal /SW and the first switch signal SW, such that the second switch signal /SW is out of phase with the first switch signal SW. However, the present invention is not limited to this, and it is acceptable as long as the design of the first transistor 412 and the second transistor 416 is complied with the requirement.

The sensing block circuit 420 is coupled to the current-to-voltage converter 410. The sensing block circuit 420 receives the voltage signal of the node A, buffer and output the bit information stored in the organic memory cell accordingly, i.e. output a Dsc_Out signal representing the bit information. The sensing block circuit 420 comprises a third transistor 422 and a fourth transistor 426. A first source/drain of the third transistor 422 is connected to the second potential, for example, the power potential VDD, and a gate of the third transistor 422 is connected to the voltage signal (node A) outputted by the current-to-voltage converter 410. A first source/drain of the fourth transistor 426 is connected to a second source/drain of the third transistor 422; a second source/drain of the fourth transistor 426 is connected to the first potential, for example, the ground potential; and a gate of the fourth transistor 426 is connected to the first switch signal SW.

The design requirement of the sensing block circuit 420 of the present invention is: when the fourth transistor 426 is off, the second source/drain of the third transistor 422 outputs the bit information stored in the organic memory cell, that is, when the fourth transistor 426 is off, the first transistor 412 is on, and the second transistor 416 is off, such that the current-to-voltage converter 410 can detect the bit information stored in the organic memory cell according to the conduction current 1_out flowing through itself, and convert it into the voltage signal on the node A, such that the sensing block circuit further outputs the Dsc_Out signal representing the bit information stored in the organic memory cell according to the voltage signal of node A. In this embodiment, the fourth transistor 426 is, for example, an N-type transistor, and the gate is directly connected to the first switch signal SW, such that the fourth transistor 426 and the first transistor 412 are out of phase when being turned on; however, the present invention is not limited to this. Similarly, the third transistor 422 is, for example, a P-type transistor, while the other type of transistors, such as an N-type transistor, can also be used.

It should be noted that the first potential is, for example, a ground potential, and the second potential is, for example, a power potential; however, the present invention is not limited to this.

In the application of the embodiment of FIG. 4, a sample and hold circuit 430 is further connected to the Dsc_Out signal outputted by the sensing block circuit 420 to reshape and output the bit information stored in the organic memory cell. The sample and hold circuit 430 comprises a switch 432 and a latch consisting of an inverter 434 and an inverter 436. When the first transistor 412 is on, the switch 432 connects the Dsc_Out signal to the latch consisting of the inverter 434 and the inverter 436 according to the sample signal S to reshape and output the bit information stored in the organic memory cells.

Figure 5:
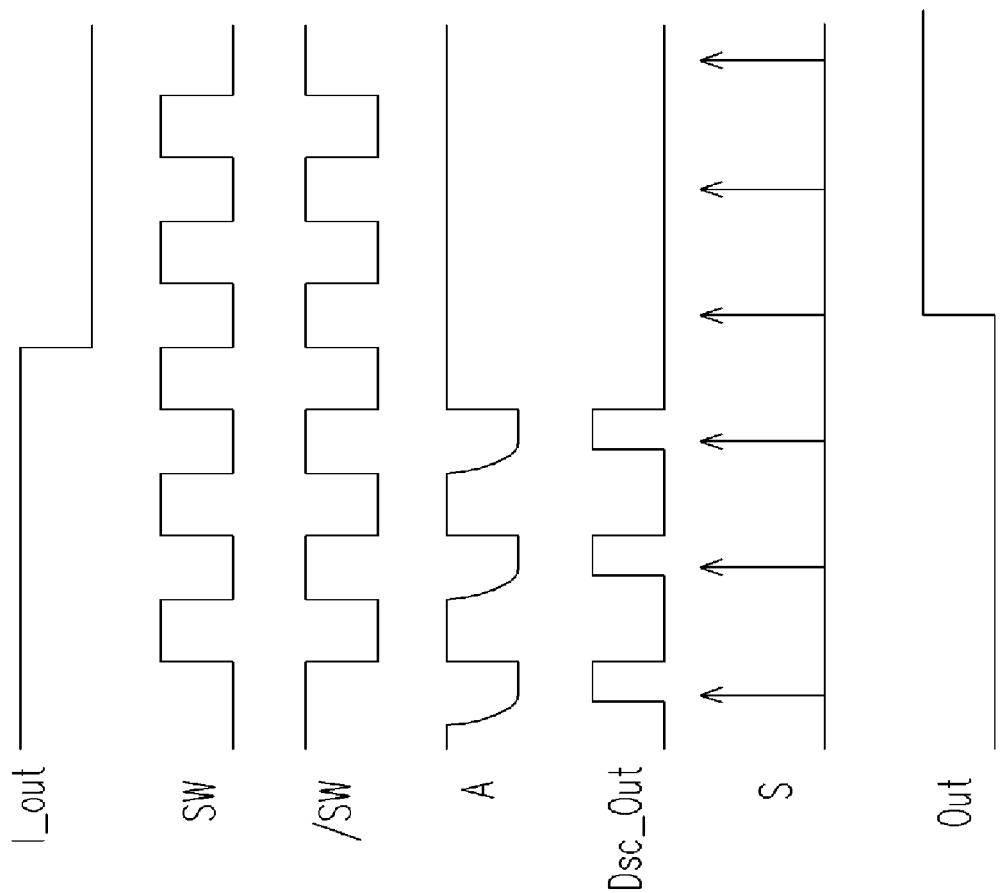
FIG. 5 shows a timing diagram of each signal of the digital sensing circuit in FIG. 4.

FIG. 5 shows a timing diagram of each signal of the digital sensing circuit in FIG. 4. Referring to FIGS. 4 and 5, it can be seen from the drawings that the first transistor 412 and the second transistor 416 are, for example, both P-type transistors, and the second switch signal /SW is out of phase with the first switch signal SW. Therefore, in a half-period when the first switch signal SW is of a high potential and the second switch signal /SW is of a low potential, the first transistor 412 is off, and the second transistor 416 is on, such that the capacitor 414 is pre-charged, and the voltage signal of the node A maintains a high potential. Then, in a half-period when the first switch signal SW is of a low potential and the second switch signal /SW is of a high potential, the first transistor 412 is on, and the second transistor 416 is off, such that the capacitor 414 is discharged and flows out a conduction current. The conduction current flow is related to the state of the organic memory cell, i.e. the memorized bit information. When the organic memory cell is in a low-impedance state, the conduction current is much lager than the one when the organic memory cell is in a high-impedance state. Therefore, when the organic memory cell is in a low-impedance state, the capacitor 414 is discharged rapidly, and the voltage of the node A is quickly reduced to a low potential, such that the third transistor 422 is turned on, and the Dsc_Out signal turns into a high potential. Correspondingly, when the organic memory cell is in a high-impedance state, the capacitor 414 is discharged slowly, the voltage of the node A may hardly vary, such that the third transistor 422 maintains to be off, and the Dsc_Out signal maintains at a low potential. Therefore, the Dsc_Out signal can represent the bit information memorized by the organic memory cell. The sample and hold circuit 430 reshapes the Dsc_Out signal to be the one which does not change along with the half-periods according to the sample signal S so as to output an output signal Out purely representing the bit information stored in the organic memory cell.

Figure 6:
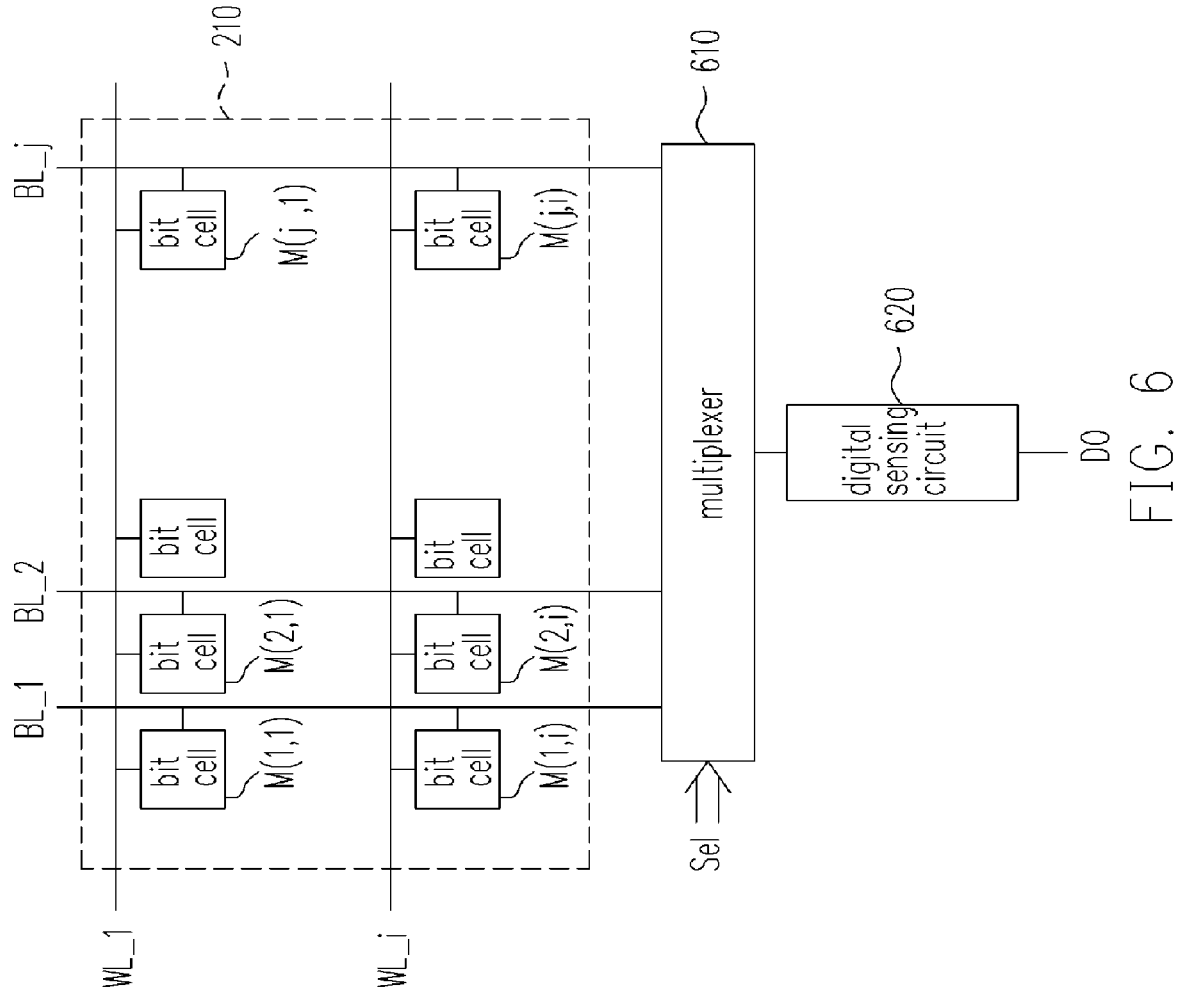
FIG. 6 shows a circuit block diagram of an organic memory according to another embodiment of the present invention.

FIG. 6 shows a circuit block diagram of an organic memory according to another embodiment of the present invention. Referring to FIG. 6, an organic memory provided by this embodiment comprises i select lines WL_1, ..., WL_i, j data lines BL_1, BL_2, ..., BL_j, a bit cell array 210, a multiplexer 610, and a digital sensing circuit 620. Except the multiplexer 610 and the digital sensing circuit 620, the rest of the elements of the circuit are the same as those of the embodiment in FIG. 2, and will not be described any more. The multiplexer 610 has an output terminal, a select terminal, and multiple input terminals. Each of the input terminals is connected to one of the data lines BL_1, BL_2, ..., BL_j respectively, and the output terminal is connected to the digital sensing circuit 620. Therefore, one of the input terminals is connected to the output terminal by the multiplexer according to the select signal Sel of the select terminal, that is, one of the data lines BL_1, BL_2, ..., BL_j is connected to the digital sensing circuit 620. When the nth select line is actuated, and when the digital sensing circuit is connected to the mth data line by the multiplexer 610, the switch elements in the bit cell row B(n) connect the organic memory cells in the bit cell row B(n) to the respective data lines, and the digital sensing circuit 620 senses and reads the bit information stored in the organic memory cell of the bit cell M(m,n). Unlike any digital sensing circuit in FIG. 2 that the current output/input terminal of the current-to-voltage converter is directly connected to one of the j data lines, a current output/input terminal of the current-to-voltage converter in the digital sensing circuit 620 is connected to the output terminal of the multiplexer.

Figure 7:
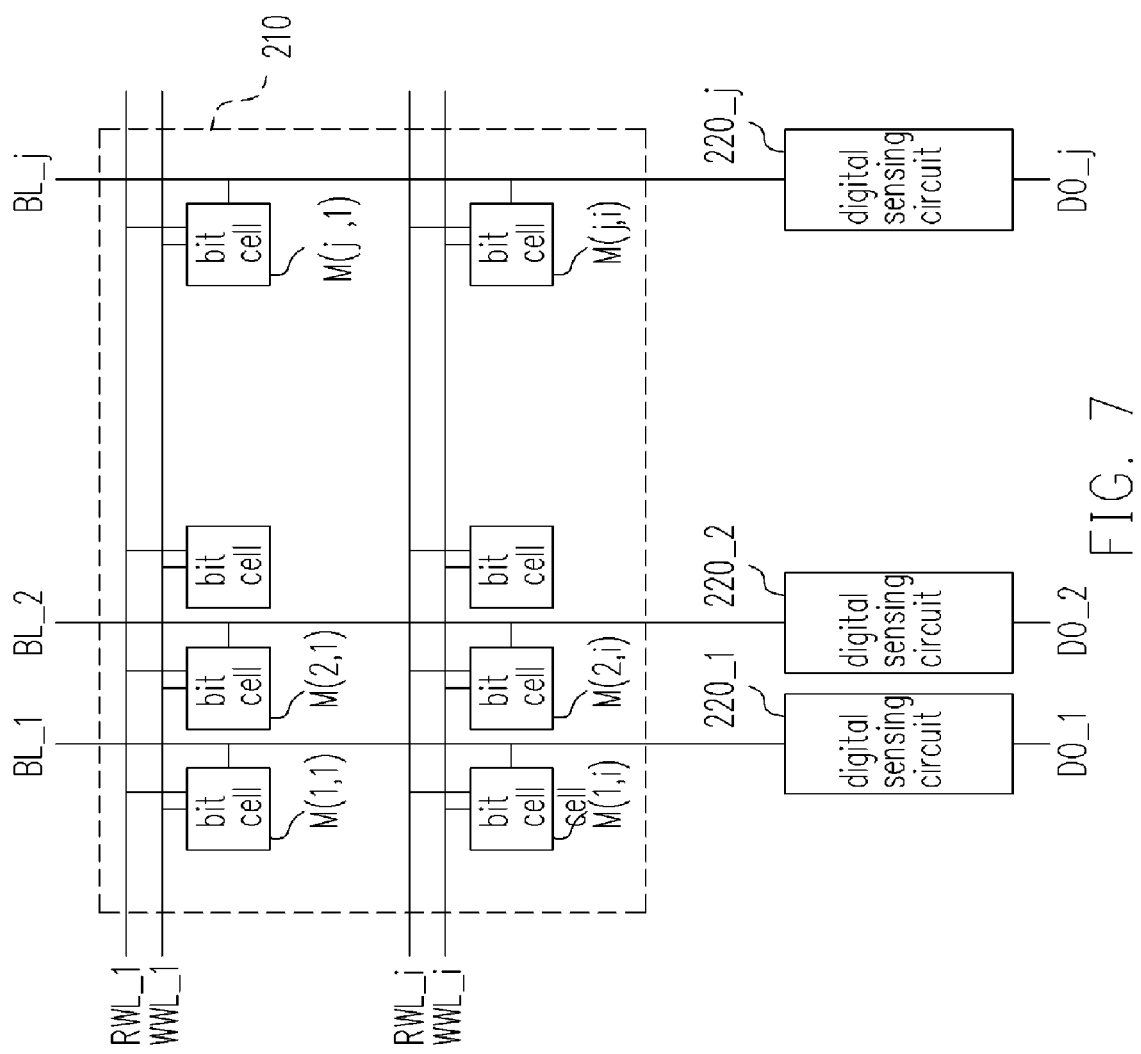
FIG. 7 shows a circuit block of an organic memory according to yet another embodiment of the present invention.

FIG. 7 shows a circuit block diagram of an organic memory according to yet another embodiment of the present invention. Referring to FIG. 7, an organic memory provided by this embodiment comprises i write select lines WWL_1, ..., WWL_i, i read select lines RWL_1, ..., RWL_i, j data lines BL_1, BL_2, ..., BL_j, a bit cell array 210, and j digital sensing circuits 220_1, 220_2, ..., 220_j. Most part of the circuit in the drawing is the same with that of the embodiment in FIG. 2, and it will not be described any more. However, each bit cell M(1,1), M(2,1), ..., M(j,1), ..., M(1,i), M(2,i), ..., M(j,i) in the bit cell array 210 is not operated by a single select line, but is written by actuating any one of the write select lines WWL_1, ..., WWL_i, or read by actuating any one of the read select lines RWL_1, ..., RWL_i.

Figure 8:
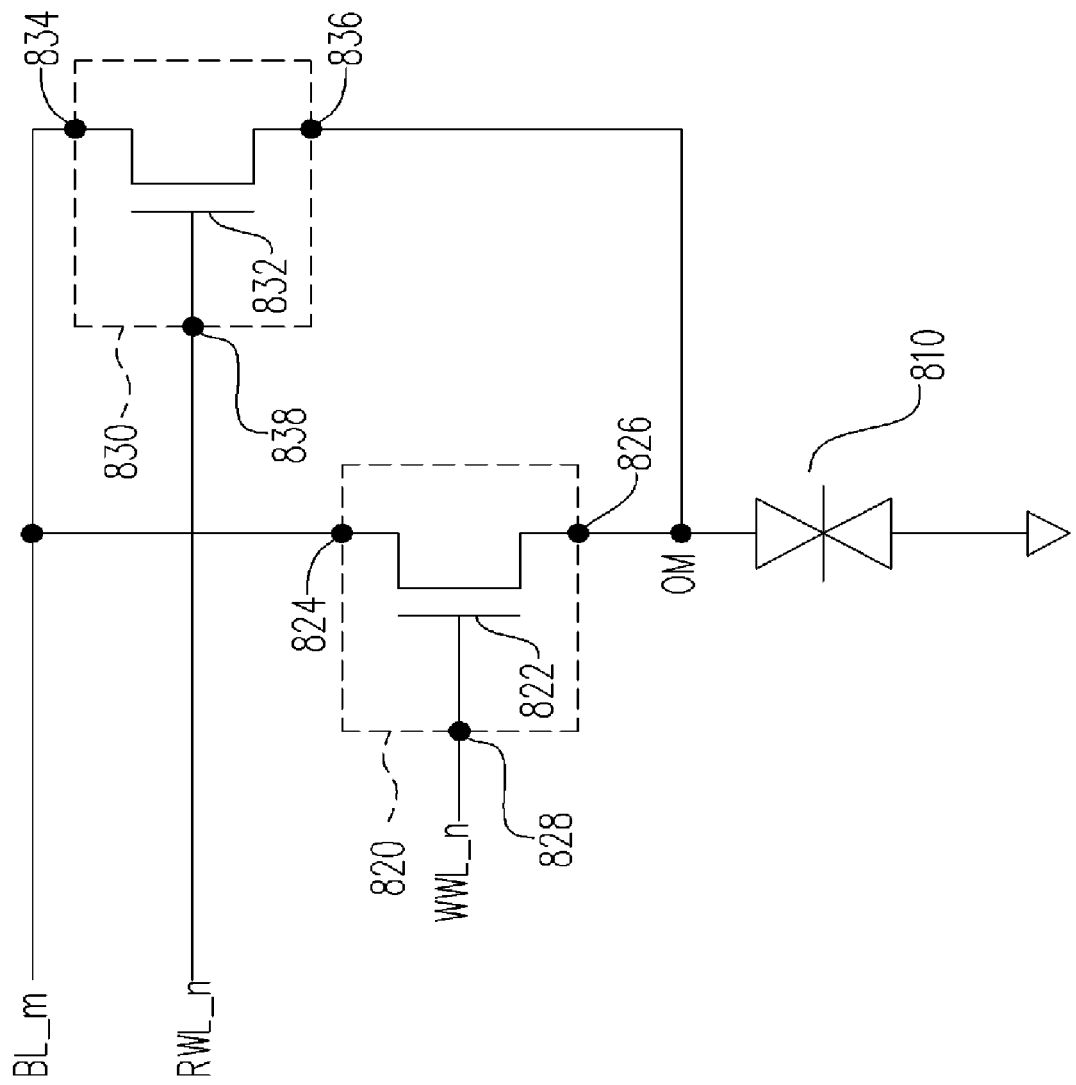
FIG. 8 shows a circuit diagram of an embodiment of the bit cell in FIG. 7.

FIG. 8 shows a circuit diagram of an embodiment of the bit cell in FIG. 7. Referring to FIG. 8, a bit cell M(m,n) of the organic memory is illustrated. The bit cell M(m,n) is connected to the data line BL_m, the write select line WWL_n, and the read select line RWL_n. The bit cell M(m,n) comprises an organic memory cell 810, a first switch element 820, and a second switch element 830. The organic memory cell 810 is the same as the one in FIG. 3, and will not be described any more.

Further referring to FIG. 8, the first switch element 820 has a first terminal 824, a second terminal 826, and a control terminal 828. The first terminal 824 of the first switch element 820 is connected to the data line BL_m; the control terminal 828 of the first switch element 820 is connected to the write select line WWL_n; and the second terminal 826 of the first switch element 820 is connected to the organic memory cell 810. Furthermore, the second switch element 830 has a first terminal 834, a second terminal 836, and a control terminal 838. The first terminal 834 of the second switch element 830 is coupled to the data line BL_m; the control terminal 838 of the second switch element 830 is connected to the read select line RWL_n; and the second terminal 836 of the second switch element 830 is connected to the organic memory cell 810. When the signal on the write select line WWL_n is actuated, the first switch element 820 connects the organic memory cell 810 to the data line BL_m, so as to write the bit information into the organic memory cell 810. When the signal on the read select line RWL_n is actuated, the second switch element 830 connects the organic memory cell 810 to the data line BL_m, so as to sense the bit information stored in the organic memory cell 810.

In this embodiment, the first switch element 820 and the second switch element 830 are a first transistor 822 and a second transistor 832 respectively. A first source/drain of the first transistor 822 is connected to the data line BL_m; a gate of the first transistor 822 is connected to the write select line WWL_n; and a second source/drain of the first transistor 822 is connected to the organic memory cell 810. A first source/drain of the second transistor 832 is also connected to the data line BL_m; a gate of the second transistor 832 is connected to the read select line RWL_n; and a second source/drain of the second transistor 832 is also connected to the organic memory cell 810. The first and second transistors 822, 832 in this embodiment both use N-type transistors. However, the present invention is not limited to this; instead, various MOS transistors can also be used. Of course, other transistors, such as P-type transistors, or a P-type transistor with an N-type transistor can be used.

Preferably, the size of the first transistor 822 is larger than the size of the second transistor 832 in the bit cell of the organic memory of this embodiment. When the signal on the write select line WWL_n is actuated, the first transistor 822 connects the organic memory cell to the data line BL_m, so as to write the bit information into the organic memory cell 810. As the size of the first transistor 822 is larger, a larger current can pass through when writing in order to reduce the time needed for changing the state of the organic memory cell 810. When the signal on the read select line RWL_n is actuated, the second transistor 832 connects the organic memory cell 810 to the data line, so as to sense the bit information of the organic memory cell 810 according to the conduction current flowing through the organic memory cell 810. As the size of the second transistor 832 becomes smaller, the parasitic capacitance of the second transistor 832 also becomes smaller, thereby reducing the gate load, and speeding up the time for accessing.

The organic material will not change its state along with the disappearance of the bias voltage, and therefore, the organic memory provided by the present invention can be applied as a non-volatile memory.

In summary, an organic memory provided by the present invention at least comprises a plurality of select lines, a plurality of data lines, a bit cell array, and a plurality of digital sensing circuits. In addition, another organic memory provided by the present invention further includes a multiplexer to reduce the use of the digital sensing circuit. The two organic memories both have a complete memory array and digital sensing mechanism. Furthermore, the present invention applies the simplest sensing circuits, thus the challenge of layout and design is extremely low so that the production yield is improved. Besides, the present invention is also suitable for the LTPS process. Therefore, the present invention provides a mass-producible and practicable memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic memory, comprising:
   i select lines;
   j data lines;
   a bit cell array, comprising a plurality of bit cells, wherein one of the bit cells is connected between each data line and each select line, each bit cell comprises an organic memory cell and a switch element, and the organic memory cell is used to store at least one bit of information; and
   j digital sensing circuits, wherein each digital sensing circuit is connected to one of the data lines and senses the bit information stored in the organic memory cell according to a conduction current flowing through the organic memory cell, and each digital sensing circuit comprises:
      a current-to-voltage converter, for converting the conduction current flowing through the current-to-voltage converter into a voltage signal, the current-to-voltage converter comprising:
         a first transistor, having a first source/drain connected to one of the data lines, and a gate connected to a first switch signal;
         a capacitor, having a first terminal connected to a second source/drain of the first transistor and a second terminal connected to a first potential, and the voltage signal is obtained from the first terminal; and
         a second transistor, having a first source/drain connected to the first terminal of the capacitor, a second source/drain connected to a second potential, and a gate connected to a second switch signal, wherein when the first transistor is on, the second transistor is off, and when the first transistor is off, the second transistor is on; and
      a sensing block circuit, coupled to the current-to-voltage converter, for receiving the voltage signal, and buffering and outputting the bit information stored in the organic memory cell, the sensing block circuit comprising:
         a third transistor, having a first source/drain directly connected to the second potential, and a gate directly connected to the first terminal of the capacitor; and
         a fourth transistor, having a first source/drain connected to a second source/drain of the third transistor, a second source/drain connected to the first potential, and a gate directly connected to the gate of the first transistor, wherein when the fourth transistor is off, the second source/drain of the third transistor outputs the bit information stored in the organic memory cell,
   wherein, the bit cell row B(n) is defined as all bit cells connected to the nth select line, when the nth select line is actuated, the switch elements in the bit cell row B(n) connect the organic memory cells in the bit cell row B(n) to the respective data lines, and the digital sensing circuits sense and read the bit information stored in the organic memory cells of the bit cell row B(n) through the data lines, wherein i, j, n are natural numbers, and n<=i.

2. The organic memory as claimed in claim 1, wherein the first transistor and the second transistor are of the same type, and the second switch signal is out of phase with the first switch signal.

3. The organic memory as claimed in claim 1, wherein the first transistor and the second transistor are of different types, and the first switch signal is the same as the second switch signal.

4. The organic memory as claimed in claim 1, wherein the first potential is a ground potential, and the second potential is a power potential.

5. The organic memory as claimed in claim 1, wherein the sensing block circuit is further connected to a sample and hold circuit for reshaping and outputting the bit information stored in the organic memory cell.

6. The organic memory as claimed in claim 1, wherein the switch element comprises a transistor, having a first source/drain connected to one of the data lines, a gate connected to one of the select lines, and a second source/drain connected to the organic memory cell.

7. The organic memory as claimed in claim 1, wherein the organic memory is a non-volatile memory.

8. An organic memory, comprising:
   i select lines;
   j data lines;
   a bit cell array, comprising a plurality of bit cells, wherein one of the bit cells is connected between each data line and each select line, each bit cell comprises an organic memory cell and a switch element, and the organic memory cell is used to store at least one bit of information;
   a multiplexer, having multiple input terminals, a select terminal, and an output terminal, wherein the input terminals are connected to one of the data lines respectively, and one of the input terminals is connected to the output terminal by the multiplexer according to the select terminal; and
   a digital sensing circuit, coupled to the output terminal of the multiplexer, wherein the digital sensing circuit senses the bit information stored in the organic memory cell according to a conduction current flowing through the organic memory cell, and the digital sensing circuit comprises:
      a current-to-voltage converter, for converting the conduction current flowing through the current-to-voltage converter into a voltage signal, the current-to-voltage converter comprising:
         a first transistor, having a first source/drain connected to the output terminal of the multiplexer, and a gate connected to a first switch signal;
         a capacitor, having a first terminal connected to a second source/drain of the first transistor, and a second terminal connected to a first potential, and the voltage signal is obtained from the first terminal; and
         a second transistor, having a first source/drain connected to the first terminal of the capacitor, a second source/drain connected to a second potential, and a gate connected to a second switch signal, wherein when the first transistor is on, the second transistor is off, and when the first transistor is off, the second transistor is on; and
      a sensing block circuit, coupled to the current-to-voltage converter, for receiving the voltage signal, and buffering and outputting the bit information stored in the organic memory cell, the sensing block circuit comprising:
         a third transistor, having a first source/drain directly connected to the second potential, and a gate directly connected to the first terminal of the capacitor; and a fourth transistor, having a first source/drain connected to a second source/drain of the third transistor, a second source/drain connected to the first potential, and a gate directly connected to the gate of the first transistor, wherein when the fourth transistor is off, the second source/drain of the third transistor outputs the bit information stored in the organic memory cell, wherein, the bit cell row B(n) is defined as all bit cells connected to the nth select line, the bit cell M(m,n) is defined as the bit cell connected to the mth data line and the nth select line; when the nth select line is actuated, and the digital sensing circuit is connected to the mth data line by the multiplexer, the switch elements in the bit cell row B(n) connect the organic memory cells in the bit cell row B(n) to the respective data lines, and the digital sensing circuit senses and reads the bit information stored in the organic memory cell of the bit cell M(m,n), wherein i, j, m, n are natural numbers, and n<=i, m<=j.

9. The organic memory as claimed in claim 8, wherein the first transistor and the second transistor are of the same type, and the second switch signal is out of phase with the first switch signal.

10. The organic memory as claimed in claim 8, wherein the first transistor and the second transistor are of different types, and the first switch signal is the same as the second switch signal.

11. The organic memory as claimed in claim 8, wherein the first potential is a ground potential, and the second potential is a power potential.

12. The organic memory as claimed in claim 8, wherein the sensing block circuit is further connected to a sample and hold circuit for reshaping and outputting the bit information stored in the organic memory cell.

13. The organic memory as claimed in claim 8, wherein the switch element comprises a transistor, having a first source/drain connected to one of the data lines, a gate connected to one of the select lines, and a second source/drain connected to the organic memory cell.

14. The organic memory as claimed in claim 8, wherein the organic memory is a non-volatile memory.

* * * * *